(12) United States Patent
Lin (10) Patent No.: US 7,547,565 B2
(45) Date of Patent: Jun. 16, 2009

(54) METHOD OF MANUFACTURING OPTICAL INTERFERENCE COLOR DISPLAY

(75) Inventor: Wen-Jian Lin, Hsinchu (TW)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 580 days.

(21) Appl. No.: 11/133,641

(22) Filed: May 20, 2005

(65) Prior Publication Data

US 2006/0177950 A1      Aug. 10, 2006

(30) Foreign Application Priority Data

Feb. 4, 2005    (TW) .............................. 94103551 A (51) Int. Cl.
H01L 21/20      (2006.01)
(52) U.S. Cl. ........................................ 438/29; 438/738
(58) Field of Classification Search ................. 438/21, 438/29, 30, 706, 738; 430/315, 321
See application file for complete search history.

(56) References Cited

U.S. PATENT DOCUMENTS

| | | | |
|---|---|---|---|
| 2,534,846 A | 12/1950 | Ambrose et al. |
| 3,439,973 A | 4/1969 | Paul et al. |
| 3,443,854 A | 5/1969 | Weiss |
| 3,616,312 A | 10/1971 | McGriff et al. |
| 3,653,741 A | 4/1972 | Marks |
| 3,656,836 A | 4/1972 | de Cremoux et al. |
| 3,725,868 A | 4/1973 | Malmer, Jr. et al. |
| 3,813,265 A | 5/1974 | Marks |
| 3,955,880 A | 5/1976 | Lierke |
| 4,099,854 A | 7/1978 | Decker et al. |

(Continued)

FOREIGN PATENT DOCUMENTS

CH      681 047      12/1992

(Continued)

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

(Continued)

*Primary Examiner*—Savitri Mulpuri
(74) *Attorney, Agent, or Firm*—Knobbe Martens Olson & Bear LLP (57) ABSTRACT

The method of manufacturing an optical interference color display is described. A first electrode structure is formed over a substrate first. At least one first area, second area and third area are defined on the first electrode structure. A first sacrificial layer is formed over the first electrode structure of the first area, the second area and the third area. Moreover, a second sacrificial layer is formed over the first sacrificial layer inside the second area and the third area. In addition, a third sacrificial layer is formed over the second sacrificial layer inside the third area. The etching rates of all sacrificial layers are different. Then, a patterned support layer is formed over the first electrode structure. Next, a second electrode layer is formed and the sacrificial layers are removed to form air gaps. Therefore, the air gaps are effectively controlled by using the material having different etching rates.

12 Claims, 6 Drawing Sheets

U.S. PATENT DOCUMENTS

| | | |
|---|---|---|
| 4,196,396 A | 4/1980 | Smith |
| 4,228,437 A | 10/1980 | Shelton |
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagirin et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannon et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |

| | | |
|---|---|---|
| 5,610,625 A | 3/1997 | Sampsell |
| 5,619,059 A | 4/1997 | Li et al. |
| 5,619,365 A | 4/1997 | Rhoades et al. |
| 5,619,366 A | 4/1997 | Rhoads et al. |
| 5,622,814 A | 4/1997 | Miyata et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,768 A | 7/1997 | Kaeiyama |
| 5,647,819 A | 7/1997 | Fujita et al. |
| 5,650,834 A | 7/1997 | Nakagawa et al. |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,673,139 A | 9/1997 | Johnson |
| 5,674,757 A | 10/1997 | Kim |
| 5,683,591 A | 11/1997 | Offenberg |
| 5,703,710 A | 12/1997 | Brinkman et al. |
| 5,706,022 A | 1/1998 | Hato |
| 5,710,656 A | 1/1998 | Goosen |
| 5,726,480 A | 3/1998 | Pister |
| 5,739,945 A | 4/1998 | Tayebati |
| 5,745,193 A | 4/1998 | Urbanus et al. |
| 5,745,281 A | 4/1998 | Yi et al. |
| 5,771,116 A | 6/1998 | Miller et al. |
| 5,784,190 A | 7/1998 | Worley |
| 5,784,212 A | 7/1998 | Hornbeck |
| 5,793,504 A | 8/1998 | Stoll |
| 5,808,780 A | 9/1998 | McDonald |
| 5,818,095 A | 10/1998 | Sampsell |
| 5,822,110 A | 10/1998 | Dabbaj |
| 5,822,170 A | 10/1998 | Cabuz et al. |
| 5,824,608 A | 10/1998 | Gotoch et al. |
| 5,825,528 A | 10/1998 | Goosen |
| 5,835,255 A | 11/1998 | Miles |
| 5,838,484 A | 11/1998 | Gossen et al. |
| 5,842,088 A | 11/1998 | Thompson |
| 5,867,302 A | 2/1999 | Fleming et al. |
| 5,912,758 A | 6/1999 | Knipe et al. |
| 5,943,158 A | 8/1999 | Ford et al. |
| 5,959,763 A | 9/1999 | Bozler et al. |
| 5,967,163 A | 10/1999 | Pan et al. |
| 5,972,193 A | 10/1999 | Chou et al. |
| 5,976,902 A | 11/1999 | Shih |
| 5,986,796 A | 11/1999 | Miles et al. |
| 6,016,693 A | 1/2000 | Viani et al. |
| 6,028,690 A | 2/2000 | Carter et al. |
| 6,031,653 A | 2/2000 | Wang |
| 6,038,056 A | 3/2000 | Florence et al. |
| 6,040,937 A | 3/2000 | Miles |
| 6,049,317 A | 4/2000 | Thompson et al. |
| 6,055,090 A | 4/2000 | Miles et al. |
| 6,057,903 A | 5/2000 | Colgan et al. |
| 6,061,075 A | 5/2000 | Nelson et al. |
| 6,099,132 A | 8/2000 | Kaeiyama |
| 6,100,872 A | 8/2000 | Aratani et al. |
| 6,113,239 A | 9/2000 | Sampsell et al. |
| 6,115,326 A | 9/2000 | Puma et al. |
| 6,147,790 A | 11/2000 | Meier et al. |
| 6,158,156 A | 12/2000 | Patrick |
| 6,160,833 A | 12/2000 | Floyd et al. |
| 6,165,890 A | 12/2000 | Kohl et al. |
| 6,166,422 A | 12/2000 | Qian et al. |
| 6,180,428 B1 | 1/2001 | Peeters et al. |
| 6,194,323 B1 | 2/2001 | Downey et al. |
| 6,195,196 B1 | 2/2001 | Kimura et al. |
| 6,201,633 B1 | 3/2001 | Peeters et al. |
| 6,204,080 B1 | 3/2001 | Hwang |
| 6,215,221 B1 | 4/2001 | Cabuz et al. |
| 6,232,936 B1 | 5/2001 | Gove et al. |
| 6,243,149 B1 | 6/2001 | Swanson et al. |
| 6,246,398 B1 | 6/2001 | Koo |
| 6,249,039 B1 | 6/2001 | Harvey et al. |
| 6,282,010 B1 | 8/2001 | Sulzbach et al. |
| 6,284,560 B1 | 9/2001 | Jech et al. |
| 6,288,472 B1 | 9/2001 | Cabuz et al. |
| 6,295,154 B1 | 9/2001 | Laor et al. |
| 6,297,072 B1 | 10/2001 | Tilmans et al. |
| 6,323,982 B1 | 11/2001 | Hornbeck |
| 6,327,071 B1 | 12/2001 | Kimura et al. |
| 6,329,297 B1 | 12/2001 | Balish et al. |
| 6,335,831 B2 | 1/2002 | Kowarz et al. |
| 6,340,435 B1 | 1/2002 | Bjorkman et al. |
| 6,351,329 B1 | 2/2002 | Greywal |
| 6,356,254 B1 | 3/2002 | Kimura |
| 6,359,673 B1 | 3/2002 | Stephenson |
| 6,376,787 B1 | 4/2002 | Martin et al. |
| 6,377,233 B2 | 4/2002 | Colgan et al. |
| 6,391,675 B1 | 5/2002 | Ehmke et al. |
| 6,392,233 B1 | 5/2002 | Channin et al. |
| 6,392,781 B1 | 5/2002 | Kim et al. |
| 6,399,512 B1 | 6/2002 | Blosse et al. |
| 6,407,851 B1 | 6/2002 | Islam et al. |
| 6,447,126 B1 | 9/2002 | Hornbeck |
| 6,448,622 B1 | 9/2002 | Franke et al. |
| 6,452,465 B1 | 9/2002 | Brown et al. |
| 6,456,420 B1 | 9/2002 | Goodwin-Johansson |
| 6,465,355 B1 | 10/2002 | Horsley |
| 6,466,354 B1 | 10/2002 | Gudeman |
| 6,466,358 B2 | 10/2002 | Tew |
| 6,473,274 B1 | 10/2002 | Maimone et al. |
| 6,480,177 B2 | 11/2002 | Doherty et al. |
| 6,496,122 B2 | 12/2002 | Sampsell |
| 6,513,911 B1 | 2/2003 | Ozaki et al. |
| 6,522,801 B1 | 2/2003 | Aksyuk et al. |
| 6,531,945 B1 | 3/2003 | Ahn et al. |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,574,033 B1 | 6/2003 | Chui et al. |
| 6,577,785 B1 | 6/2003 | Spahn et al. |
| 6,589,625 B1 | 7/2003 | Kothari et al. |
| 6,600,201 B2 | 7/2003 | Hartwell et al. |
| 6,602,791 B2 | 8/2003 | Ouellet et al. |
| 6,606,175 B1 | 8/2003 | Sampsell et al. |
| 6,608,268 B1 | 8/2003 | Goldsmith |
| 6,610,440 B1 | 8/2003 | LaFollette et al. |
| 6,618,187 B2 | 9/2003 | Pilossof |
| 6,625,047 B2 | 9/2003 | Coleman, Jr. |
| 6,630,786 B2 | 10/2003 | Cummings et al. |
| 6,632,698 B2 | 10/2003 | Ives |
| 6,635,919 B1 | 10/2003 | Melendez et al. |
| 6,642,913 B1 | 11/2003 | Kimura et al. |
| 6,643,069 B2 | 11/2003 | Dewald |
| 6,650,455 B2 | 11/2003 | Miles |
| 6,657,832 B2 | 12/2003 | Williams et al. |
| 6,666,561 B1 | 12/2003 | Blakley |
| 6,674,033 B1 | 1/2004 | Wang |
| 6,674,090 B1 | 1/2004 | Chua et al. |
| 6,674,562 B1 | 1/2004 | Miles et al. |
| 6,680,792 B2 | 1/2004 | Miles |
| 6,687,896 B1 | 3/2004 | Miles |
| 6,710,908 B2 | 3/2004 | Miles et al. |
| 6,713,235 B1 | 3/2004 | Ide et al. |
| 6,720,267 B1 | 4/2004 | Chen et al. |
| 6,736,987 B1 | 5/2004 | Cho |
| 6,741,377 B2 | 5/2004 | Miles |
| 6,741,384 B1 | 5/2004 | Martin et al. |
| 6,741,503 B1 | 5/2004 | Farris et al. |

| | | |
|---|---|---|
| 6,743,570 B2 | 6/2004 | Harnett et al. |
| 6,747,785 B2 | 6/2004 | Chen et al. |
| 6,747,800 B1 | 6/2004 | Lin |
| 6,756,317 B2 | 6/2004 | Sniegowski et al. |
| 6,768,097 B1 | 7/2004 | Viktorovitch et al. |
| 6,775,174 B2 | 8/2004 | Huffman et al. |
| 6,778,155 B2 | 8/2004 | Doherty et al. |
| 6,778,306 B2 | 8/2004 | Sniegowski et al. |
| 6,782,166 B1 | 8/2004 | Grote et al. |
| 6,794,119 B2 | 9/2004 | Miles |
| 6,806,110 B2 * | 10/2004 | Lester et al. .................. 438/28 |
| 6,811,267 B1 | 11/2004 | Allen et al. |
| 6,812,482 B2 | 11/2004 | Fleming et al. |
| 6,819,469 B1 | 11/2004 | Koba |
| 6,822,628 B2 | 11/2004 | Dunphy et al. |
| 6,829,132 B2 | 12/2004 | Martin et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,890,778 B2 * | 5/2005 | Kapon et al. .................. 438/22 |
| 6,905,621 B2 | 6/2005 | Ho et al. |
| 6,912,022 B2 | 6/2005 | Lin et al. |
| 6,952,303 B2 | 10/2005 | Lin et al. |
| 6,953,702 B2 * | 10/2005 | Miller et al. .................. 438/22 |
| 6,958,847 B2 | 10/2005 | Lin |
| 6,972,891 B2 | 12/2005 | Patel et al. |
| 6,980,350 B2 | 12/2005 | Hung et al. |
| 6,982,820 B2 | 1/2006 | Tsai |
| 6,995,890 B2 | 2/2006 | Lin |
| 6,999,225 B2 | 2/2006 | Lin |
| 6,999,236 B2 | 2/2006 | Lin |
| 7,008,812 B1 | 3/2006 | Carley |
| 7,012,726 B1 | 3/2006 | Miles |
| 7,016,095 B2 * | 3/2006 | Lin ............................ 359/254 |
| 7,027,202 B1 | 4/2006 | Hunter et al. |
| 7,041,224 B2 | 5/2006 | Patel et al. |
| 7,041,571 B2 | 5/2006 | Strane |
| 7,049,164 B2 | 5/2006 | Bruner |
| 7,050,219 B2 | 5/2006 | Kimura |
| 7,078,293 B2 | 7/2006 | Lin et al. |
| 7,110,158 B2 | 9/2006 | Miles |
| 7,119,945 B2 | 10/2006 | Cummings et al. |
| 7,198,973 B2 * | 4/2007 | Lin et al. ...................... 438/48 |
| 7,221,495 B2 | 5/2007 | Miles et al. |
| 7,289,259 B2 * | 10/2007 | Chui et al. .................. 359/291 |
| 7,327,510 B2 | 2/2008 | Cummings et al. |
| 2001/0003487 A1 | 6/2001 | Miles |
| 2001/0010953 A1 | 8/2001 | Kang et al. |
| 2001/0026951 A1 | 10/2001 | Vergani et al. |
| 2001/0040649 A1 | 11/2001 | Ozaki |
| 2001/0040675 A1 | 11/2001 | True et al. |
| 2002/0014579 A1 | 2/2002 | Dunfield |
| 2002/0015215 A1 | 2/2002 | Miles et al. |
| 2002/0021485 A1 | 2/2002 | Pilossof |
| 2002/0024711 A1 | 2/2002 | Miles |
| 2002/0036304 A1 | 3/2002 | Ehmke et al. |
| 2002/0054424 A1 | 5/2002 | Miles |
| 2002/0055253 A1 | 5/2002 | Rudhard |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0110948 A1 | 8/2002 | Huang et al. |
| 2002/0117728 A1 | 8/2002 | Brosnihan et al. |
| 2002/0126364 A1 | 9/2002 | Miles |
| 2002/0135857 A1 | 9/2002 | Fitzpatrick et al. |
| 2002/0137072 A1 | 9/2002 | Mirkin et al. |
| 2002/0149828 A1 | 10/2002 | Miles |
| 2002/0168136 A1 | 11/2002 | Atia et al. |
| 2003/0006468 A1 | 1/2003 | Ma et al. |
| 2003/0043157 A1 | 3/2003 | Miles |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0090350 A1 | 5/2003 | Feng et al. |
| 2003/0112096 A1 | 6/2003 | Potter |
| 2003/0138213 A1 | 7/2003 | Jiin et al. |
| 2003/0152872 A1 | 8/2003 | Miles |
| 2003/0201784 A1 | 10/2003 | Potter |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0231373 A1 | 12/2003 | Kowarz |
| 2004/0010115 A1 | 1/2004 | Sotzing |
| 2004/0027636 A1 | 2/2004 | Miles |
| 2004/0027701 A1 | 2/2004 | Ishikawa |
| 2004/0028849 A1 | 2/2004 | Stark et al. |
| 2004/0035821 A1 | 2/2004 | Doan et al. |
| 2004/0038513 A1 | 2/2004 | Kohl et al. |
| 2004/0051929 A1 | 3/2004 | Sampsell et al. |
| 2004/0053434 A1 | 3/2004 | Bruner |
| 2004/0058531 A1 | 3/2004 | Miles et al. |
| 2004/0058532 A1 | 3/2004 | Miles et al. |
| 2004/0061543 A1 | 4/2004 | Nam et al. |
| 2004/0063322 A1 | 4/2004 | Yang |
| 2004/0080807 A1 | 4/2004 | Chen et al. |
| 2004/0080832 A1 | 4/2004 | Singh |
| 2004/0087086 A1 | 5/2004 | Lee |
| 2004/0100677 A1 | 5/2004 | Huibers et al. |
| 2004/0124073 A1 | 7/2004 | Pilans et al. |
| 2004/0124483 A1 | 7/2004 | Partridge et al. |
| 2004/0124495 A1 | 7/2004 | Chen et al. |
| 2004/0125281 A1 * | 7/2004 | Lin ............................ 349/113 |
| 2004/0125282 A1 * | 7/2004 | Lin et al. .................... 349/113 |
| 2004/0125536 A1 | 7/2004 | Arney et al. |
| 2004/0136076 A1 | 7/2004 | Tayebati |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard |
| 2004/0150869 A1 | 8/2004 | Kasai |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0191946 A1 | 9/2004 | Patel et al. |
| 2004/0197526 A1 | 10/2004 | Mehta |
| 2004/0207897 A1 | 10/2004 | Lin |
| 2004/0207898 A1 * | 10/2004 | Lin et al. .................... 359/254 |
| 2004/0209192 A1 | 10/2004 | Lin et al. |
| 2004/0209195 A1 * | 10/2004 | Lin ............................ 430/315 |
| 2004/0212026 A1 | 10/2004 | Van Brocklin et al. |
| 2004/0217264 A1 | 11/2004 | Wood et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |

| | | | | | | |
|---|---|---|---|---|---|---|
| 2005/0014374 | A1 | 1/2005 | Partridge et al. | JP | 2004-206049 | 7/2004 |
| 2005/0020089 | A1 | 1/2005 | Shi et al. | JP | 2004-212656 | 7/2004 |
| 2005/0024557 | A1 | 2/2005 | Lin | JP | 2004-326072 | 11/2004 |
| 2005/0035699 | A1 | 2/2005 | Tsai | JP | 2004-354977 | 12/2004 |
| 2005/0036095 | A1 | 2/2005 | Yeh et al. | JP | 2005-051007 | 2/2005 |
| 2005/0036192 | A1 | 2/2005 | Lin et al. | KR | 2002-9270 | 10/1999 |
| 2005/0038950 | A1 | 2/2005 | Adelmann | KR | 2000-0033006 | 6/2000 |
| 2005/0042117 | A1 | 2/2005 | Lin | KR | 2004-0018469 | 3/2004 |
| 2005/0046922 | A1 | 3/2005 | Lin et al. | KR | 2000-0000907 | 1/2005 |
| 2005/0046948 | A1 | 3/2005 | Lin | TW | 157313 | 5/1991 |
| 2005/0057442 | A1 | 3/2005 | Way | WO | WO 91/05484 | 4/1991 |
| 2005/0068583 | A1 | 3/2005 | Gutkowski et al. | WO | WO 92/10925 | 6/1992 |
| 2005/0068605 | A1 | 3/2005 | Tsai | WO | WO9530924 | 11/1995 |
| 2005/0068606 | A1 | 3/2005 | Tsai | WO | WO9717628 | 5/1997 |
| 2005/0069209 | A1 | 3/2005 | Damera-Venkata et al. | WO | WO9952006 A2 | 10/1999 |
| 2005/0078348 | A1 | 4/2005 | Lin | WO | WO9952006 A3 | 10/1999 |
| 2005/0098840 | A1 | 5/2005 | Fuertsch et al. | WO | WO 01/14248 | 3/2001 |
| 2005/0118832 | A1 | 6/2005 | Korzenski et al. | WO | WO 01/63657 | 8/2001 |
| 2005/0168849 | A1 | 8/2005 | Lin | WO | WO 02/24570 | 3/2002 |
| 2005/0170670 | A1 | 8/2005 | King et al. | WO | WO06/36542 | 4/2002 |
| 2005/0195462 | A1 | 9/2005 | Lin | WO | WO 03/007049 A1 | 1/2003 |
| 2005/0195467 | A1 | 9/2005 | Kothari et al. | WO | WO 03/052506 | 6/2003 |
| 2005/0202649 | A1 | 9/2005 | Hung et al. | WO | WO 03/069413 A | 8/2003 |
| 2006/0066932 | A1 | 3/2006 | Chui | WO | WO03073151 A1 | 9/2003 |
| 2006/0076311 | A1 | 4/2006 | Tung et al. | WO | WO2004006003 A1 | 1/2004 |
| 2006/0077502 | A1 | 4/2006 | Tung et al. | WO | WO2004026757 A2 | 4/2004 |
| 2006/0077529 | A1 | 4/2006 | Chui et al. | WO | WO 2004/055885 | 7/2004 |
| 2006/0256420 | A1 | 11/2006 | Miles et al. | WO | WO 2004/079056 | 9/2004 |
| 2006/0257070 | A1 | 11/2006 | Lin et al. | WO | WO 2005/019899 A1 | 3/2005 |
| 2007/0269748 | A1 | 11/2007 | Miles | WO | WO 2005/061378 | 7/2005 |
| 2008/0026328 | A1 | 1/2008 | Miles | WO | WO 2005/085932 A | 9/2005 |
| 2008/0068699 | A1 | 3/2008 | Miles | WO | WO 2006/036385 | 4/2006 |
| 2008/0130089 | A1 | 6/2008 | Miles | WO | WO 2006/036437 | 4/2006 |

FOREIGN PATENT DOCUMENTS

| | | |
|---|---|---|
| CN | 092109265 | 11/2003 |
| DE | 199 38 072 | 3/2000 |
| DE | 102 28 946 A | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 A | 2/1996 |
| EP | 0 788 005 | 8/1997 |
| EP | 0878824 | 11/1998 |
| EP | 1197778 A | 4/2002 |
| EP | 1 209 738 | 5/2002 |
| EP | 1258860 A1 | 11/2002 |
| EP | 1 452 481 A | 9/2004 |
| JP | 49-004993 | 1/1974 |
| JP | 05275401 A1 | 10/1993 |
| JP | 10500224 | 1/1998 |
| JP | 10-148644 | 6/1998 |
| JP | 10-267658 | 10/1998 |
| JP | 11-097799 | 4/1999 |
| JP | 11211999 A | 8/1999 |
| JP | 11243214 | 9/1999 |
| JP | 2000-40831 A | 2/2000 |
| JP | 2001-085519 | 3/2001 |
| JP | 2002-287047 | 3/2001 |
| JP | 2001-110789 | 4/2001 |
| JP | 2002-016140 | 1/2002 |
| JP | 2002 062493 | 2/2002 |
| JP | 2002-207182 | 7/2002 |
| JP | 2002-243937 | 8/2002 |
| JP | 2002-270575 | 9/2002 |
| JP | 2002-328313 | 11/2002 |
| JP | 2002-355800 | 12/2002 |
| JP | 2003-001598 | 1/2003 |
| JP | 2004-102022 A | 4/2004 |
| JP | 2004-133281 | 4/2004 |
| JP | 2004106074 A | 4/2004 |

OTHER PUBLICATIONS

Aratani et al., "Surface micromachined tuneable interferometer array," Sensors and Actuators, pp. 17-23. (1994).
Akasaka, "Three-Dimensional IC Trends," Proceedings of IEEE, vol. 74, No. 12, pp. 1703-1714, (Dec. 1986).
Austrian Search Report for EX64/2005 dated May 4, 2005.
Austrian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Austrian Search Report dated Aug. 12, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Conner, "Hybrid Color Display Using Optical Interference Filter Array," SID Digest, pp. 577-580 (1993).
Crouse, "Self-ordered pore structure of anodized aluminium on silicon and pattern transfer" Applied Physics Letters, vol. 76, No. 1, Jan. 3, 2000. pp. 49-51.
EP 05255661.0 European Search Report (Dec. 30, 2005).
Fan et al., "Channel Drop Filters in Photonic Crystals," Optics Express, vol. 3, No. 1 (1998).
French, P.J. "Development of Surface Micromachining techniques compatable with on-chip electronics" Journal of Micromechanics and Microengineering vol. 6 No. 2, 197-211 XP 002360789 Jun. 1996 IOP Publishing.
Furneaux, et al. "The Formation of Controlled-porosity membranes from Anodically Oxidized Aluminium" Nature vo 337 Jan. 12, 1989, pp. 147-149.
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).

Goossen et al., "Possible Display Applications of the Silicon Mechanical Anti-Reflection Switch," Society for Information Display (1994).

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).

Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.

Gosch, "West Germany Grabs the Lead in X-Ray Lithography," Electronics pp. 78-80 (Feb. 5, 1987).

Harnett et al., "Heat-depolymerizable polycarbonate as electron beam patternable sacrificial layers for nanofluidics," J. Vac. Sci. Technol. B 19(6), (Nov./Dec. 2001), pp. 2842-2845.

Howard et al., "Nanometer-Scale Fabrication Techniques," VLSI Electronics: Microstructure Science, vol. 5, pp. 145-153 and pp. 166-173 (1982).

Ibbotson et al., "Comparison of XeF2 and F-atom reactions with Si and SiO2," Applied Physics Letters, vol. 44, No. 12, pp. 1129-1131 (Jun. 1984).

Jackson "Classical Electrodynamics," John Wiley & Sons Inc., pp. 568-573. (date unknown).

Jerman et al., "A Miniature Fabry-Perot Interferometer with a Corrugated Silicon Diaphragm Support," (1988).

Jerman J. H. et al., "Maniature Fabry-Perot Interfereometers Micromachined in Silicon for Use in Optical Fiber WDM Systems," Transducers. San Francisco, Jun. 24-27, 1991, Proceedings of the International Conference on Solid State Sensors Andactuators, New Youk, IEEE, US, vol. Conf. 6, Jun. 24, 1991.

Joannopoulos et al., "Photonic Crystals: Molding the Flow of Light," Princeton University Press (1995).

Johnson, "Optical Scanners," Microwave Scanning Antennas, vol. 1, p. 251-261, (1964).

Kim et al., "Control of Optical Transmission Through Metals Perforated With Subwavelength Hole Arrays," Optic Letters, vol. 24, No. 4, pp. 256-257, (Feb. 1999).

Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).

Lee et al., "The Surface/Bulk Micromachining (SBM) Process: A New Method for Fabricating Release MEMS in Single Crystal Silicon", Journal of Microelectromechanical Systems, vol. 8, Issue 4, pp. 409-416, (Dec. 1999).

Lieberman, "MEMS Display Looks to Give PDAs Sharper Image," EE Times (Feb. 11, 1997).

Lieberman, "Microbridges at Heart of New MEMS Displays," EE Times (Apr. 24, 1997).

Light over Matter, Circle No. 36 (Jun. 1993).

Lin et al., "Free-Space Micromachined Optical Switches for Optical Networking," IEEE Journal of Selected Topics in Quantum Electronics, vol. 5, No. 1, pp. 4-9. (Jan./Feb. 1999).

Little et al., "Vertically Coupled Microring Resonator Channel Dropping Filter," IEEE Photonics Technology Letters, vol. 11, No. 2, (1999).

Magel, "Integrated Optic Devices Using Micromachined Metal Membranes," SPIE vol. 2686, 0-8194-2060-Mar. 1996.

Maboudian, et al. Critical Review: Adhesion in Surface Micromechanical Structures: J. Vac. Sci Techno. B 15(1) Jan./Feb. 1997, pp. 1-20.

Microchem, LOR Lift-Off Resists Datasheet, 2002.

Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).

Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).

Miles, Mark, W., "A New Reflective FPD Technology Using Interferometric Modulation," The Proceedings of the Society for Information Display (May 11-16, 1997).

Nagami et al., "Plastic Cell Architecture: Towards Reconfigurable Computing For General-Purpose," IEEE, 0-8186-8900-, pp. 68-77, (May 1998).

Newsbreaks, "Quantum-trench devices might operate at terahertz frequencies," Laser Focus World (May 1993).

Oliner et al., "Radiating Elements and Mutual Coupling," Microwave Scanning Antennas, vol. 2, pp. 131-141, (1966).

Penta Vacuum MEMS Etcher Specifications, http://www.pentavacuum.com/memes.htm, Jan. 5, 2005.

Raley et al., "A Fabry-Perot Microinterferometer for Visible Wavelengths," IEEE Solid-State Sensor and Actuator Workshop, Jun. 1992, Hilton Head, SC.

Schnakenberg, et al. TMAHW Etchants for Silicon Micromachining. 1991 International Conference on Solid State Sensors and Actuators-Digest of Technical Papers. pp. 815-818.

Science and Technology, The Economist, pp. 89-90, (May 1999).

Search Report PCT/US02/13442 (Sep. 13, 2002).

Search Report PCT/US04/20330 (Nov. 8, 2004).

Search Report PCT/US05/031237.

Search Report PCT/US05/030033 and Written Opinion.

Search Report PCT/US05/030902 And Written Opinion.

Search Report and Written Opinion for PCT/US05/33558 (May 19, 2005).

Search Report PCT/US05/032331 (Jan. 9, 2006).

Search Report PCT/US05/032331 (Apr. 7, 2006).

Search Report and Written Opinion for PCT/US05/032647.

PCT/US05/029821 International Search Report (Dec. 27, 2005).

PCT/US05/030927 International Search Report (Jan. 25, 2006).

PCT/US05/031693 International Search Report.

PCT/US05/033558 Partial International Search Report (Feb. 24, 2006).

PCT/US2004/035820 International Search Report and Written Opinion (Apr. 11, 2005).

PCT/US96/17731 Search Report.

Sperger et al., "High Performance Patterned All-Dielectric Interference Colour Filter for Display Applications," SID Digest, pp. 81-83, (1994).

Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.

Stone, "Radiation and Optics, An Introduction to the Classical Theory," McGraw-Hill, pp. 340-343, (1963).

Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physice 98, 073528 (2005).

Thin Film Transistors- Materials and Processes -vol. 1 Amorphous Silicon Thin Film Transistors ed. Yue Kuo, Kluwer Academic Publishers, Boston (2004).

Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors," ASIA Display '95, pp. 929-931, (Oct. 1995).

Zhou et al., "Waveguide Panel Display Using Electromechanical Spatial Modulators" SID Digest, vol. XXIX, (1998).

Xactix Xetch X3™ Specifications, http://www.xactix.com/Xetch_X3specs.htm, Jan. 5, 2005.

Xactix Xetch™ Product Information.

Korean Office Action dated Apr. 16, 2007 for Korean Patent Application No. 10-2005-0061431.

Office Action from Japanese Patent Application No. 2005-171249 dated Feb. 5, 2008.

Office Action from U.S. Appl. No. 10/713,508 dated Sep. 7, 2006.

Office Action received Jul. 23, 2008 in Chinese App. No. 2005100076887.

Yao et al., BrF3 dry release technology for large freestanding parylene microstructures and electrostatic actuators, Sensors and Actuators A, vol. 97-98, pp. 771-775, Apr. 2002.

Notification of Reasons dated Feb. 5, 2008 for Rejection for Japanese App. No. 2005-171249.

Notice to Submit a Response dated Oct. 31, 2006 in Korean App. No. 10-2005-0061431.

Final Office Action dated Oct. 1, 2007 in Korean App. No. 10-2005-0061431.

* cited by examiner

METHOD OF MANUFACTURING OPTICAL INTERFERENCE COLOR DISPLAY

CROSS-REFERENCE TO RELATED APPLICATION

This application claims the priority benefit of Taiwan application serial no. 94103551, filed on Feb. 4, 2005. All disclosure of the Taiwan application is incorporated herein by reference.

BACKGROUND OF THE INVENTION

1. Field of the Invention

The present invention relates to a method of fabricating an optical interference color display, and more particularly to a method of fabricating an optical interference color display capable of controlling air gaps formed in the optical interference color display precisely.

2. Description of the Related Art

Panel displays, such as liquid crystal (LCD) displays, organic electro-luminescence (OEL) displays, or plasma display panels (PDPs), which are light and slim, have been widely used in our daily life. Wherein, LCD displays have gradually dominated the market. However, LCD displays still have some disadvantages. For example, the angles are not wide enough, the response time is not fast, and requirement of using polarizer results in poor utilization of light source.

Figure 1:
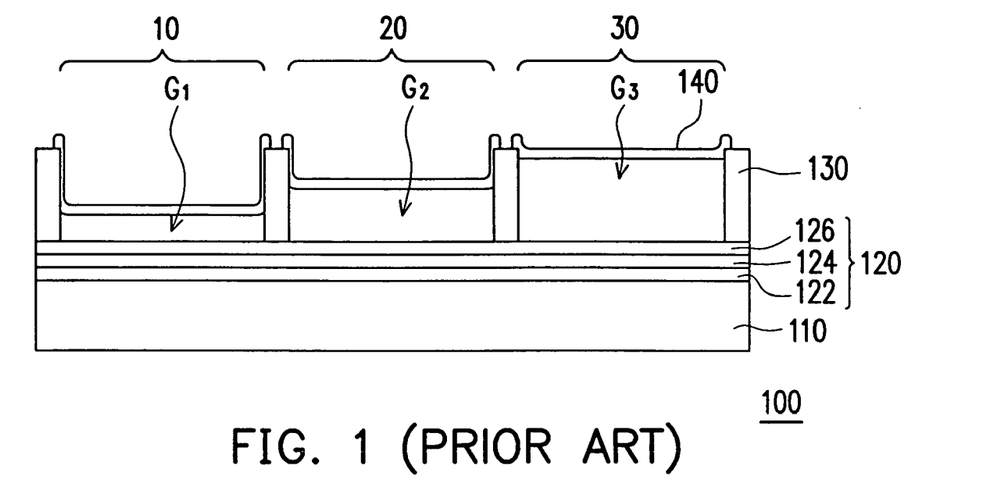
FIG. 1 is a schematic drawing showing a conventional optical interference color display.

An optical interference color display has been developed to date. FIG. 1 is a schematic drawing showing a conventional optical interference color display. The conventional optical interference color display 100 comprises a transparent substrate 110, a first electrode structure 120, a patterned support layer 130 and a second electrode layer 140. The first electrode structure 120 comprises a plurality of first electrodes 122, an absorption layer 124 and an optical layer 126, from bottom to top. Note that a plurality of air gaps G1-G3 is formed (defined) between the first electrode structure 120 and the optical layer 126.

After propagating into the first electrode structure 120 through the transparent substrate 110, light propagates to the first electrode structure 120 through the air gaps G1-G3. Then, the light is reflected by the second electrode layer 140 and propagates through the first electrode structure 120. Due to different light interferences in the different air gaps G1-G3, different color lights, such as red, green and blue lights, are generated for displaying. The forming of the air gaps G1-G3, however, is determined by the thicknesses of the sacrificial layers. Detailed description will be mentioned later. In other words, the quality of the sacrificial layers will affect the optical performance of the optical interference color display 100.

Figure 2A:
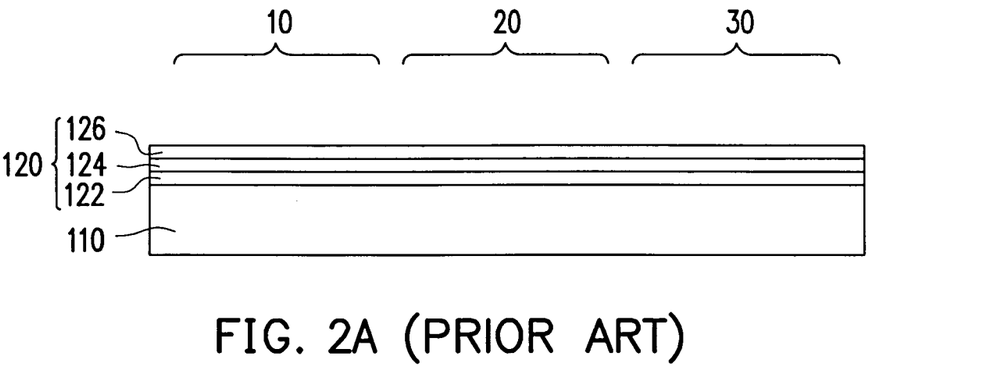
FIGS. 2A-2D are cross sectional views showing progress of a method of forming sacrificial layers.

FIGS. 2A-2D are cross sectional views showing progress of a method of forming sacrificial layers. Referring to FIG. 2A, a transparent substrate 110 is provided. A first electrode structure 120 is then formed over the transparent substrate 110. The first electrode structure 120 comprises a plurality of first electrodes 122, an absorption layer 124 and an optical layer 126, from bottom to top. In addition, a first area 10, a second area 20 and a third area 30 are defined on the first electrode structure 120.

Figure 2B:
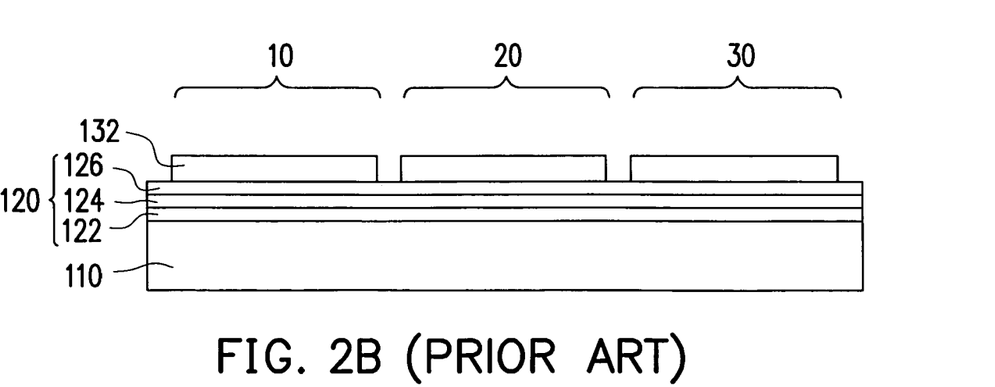

Referring to FIG. 2B, a first sacrificial layer 132, e.g., amorphous silicon, is entirely deposited. A photolithographic process and an etch process are performed to remove the first sacrificial layer 132 outside the first area 10, the second area 20 and the third area 30 to form a first sacrificial layer 132 with designated patterning.

Figure 2C:
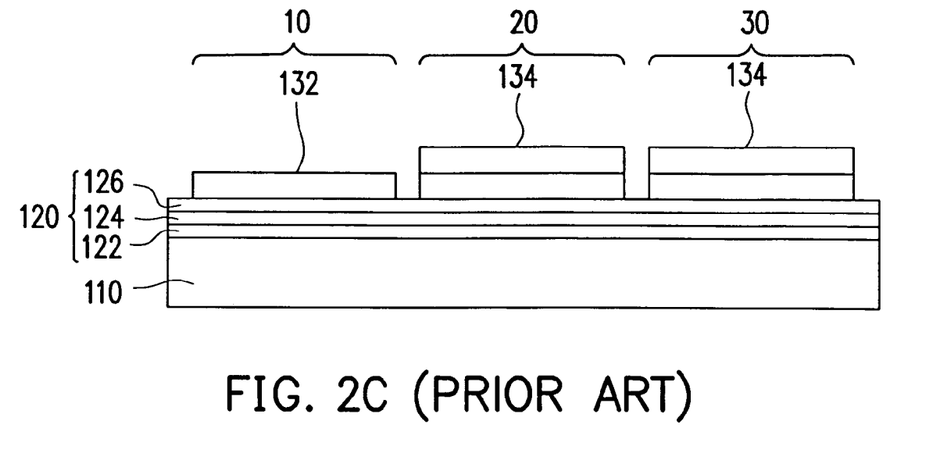

Referring to FIG. 2C, a second sacrificial layer 134 is entirely deposited. The second sacrificial layer 134 and the first sacrificial layer 132 are the same material. A photolithographic process and an etch process are performed to remove the second sacrificial layer 134 outside the second area 20 and the third area 30 to form a second sacrificial layer 134 with designated patterning. Note that while removing the second sacrificial layer 134 of the first area 10 by the etch process, the first sacrificial layer 132 and the second sacrificial layer 134 are the same material, i.e., the same etching rate. Accordingly, the first sacrificial layer 132 is easily damaged by the etchant used in the etch process such that the original thickness of the sacrificial layer 132 is changed. That causes impact to the subsequent processes.

Figure 2D:
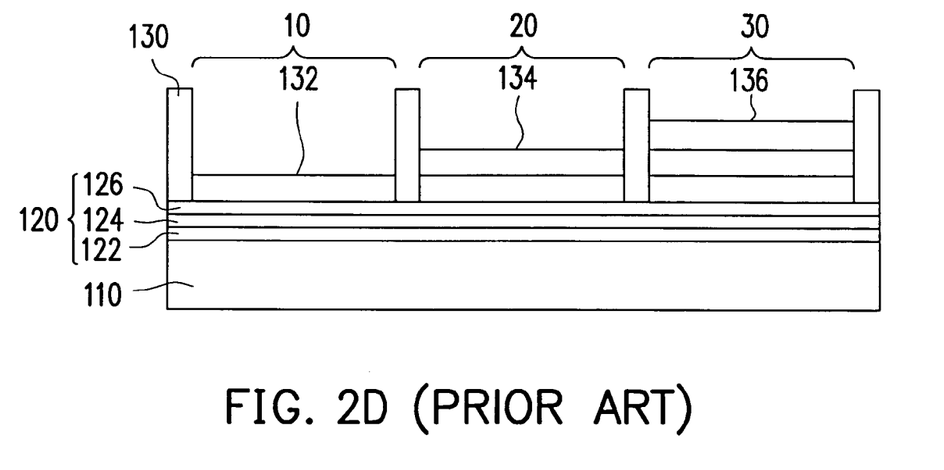

Referring to FIG. 2D, a third sacrificial layer 136 is entirely deposited. The third sacrificial layer 136, the second sacrificial layer 134 and the first sacrificial layer 132 are the same material. A photolithographic process and an etch process are performed to remove the third sacrificial layer 136 outside the third area 30 to form a third sacrificial layer 136 with designated patterning. The process of forming the sacrificial layers is thus complete. Note that the third sacrificial layer 136 is on the first sacrificial layer 132 while the third sacrificial layer 136 of the first area 10 is removed by the etch process, thus the first sacrificial layer 132 is damaged easily. Similarly, while removing the third sacrificial layer 136 of the second area 20, the third sacrificial layer 136 is on the first sacrificial layer 132, and the first sacrificial layer 132 and the third sacrificial layer 136 have the same etching rate. Accordingly, while the third sacrificial layer 136 is removed, the second sacrificial layer 134 is also damaged easily.

Finally, a photoresist layer is entirely coated. The photoresist layer is then patterned to form a patterned support layer 130. Then, a second electrode layer 140 is formed over the sacrificial layers with different thicknesses of the first area 10, the second area 20 and the third area 30, and a portion of the patterned support layer 130. Thereafter, etchant, such as $XeF_6$, is then used to remove all sacrificial layers 132, 134 and 136 to form different air gaps G1-G3 as shown in FIG. 1.

In other words, the thicknesses of the deposited sacrificial layers determine the formation of the air gaps G1-G3. If the desired thicknesses of the sacrificial layers are changed due to the damaged sacrificial layers, the dimensions of the air gaps G1-G3 cannot be precisely controlled. The optical performance of the optical interference color display 100 is seriously affected. Under the described unstable manufacturing processes, yields are declined and manufacturing costs are also increased.

SUMMARY OF THE INVENTION

Accordingly, the present invention is directed to a method of fabricating an optical interference color display. In this method, the thicknesses of the sacrificial layers can be precisely controlled so that better air gaps can be obtained.

The present invention is also directed to a method of fabricating an optical interference color display. In this method, better air gaps can be formed, and the optical performance of the optical interference color display can be enhanced.

As embodied and broadly described herein, a method of fabricating an optical interference color display is provided. In this method, a substrate is first provided. A first electrode structure is formed over the substrate. A first area, a second area and a third area are then defined on the first electrode structure. A first sacrificial layer is formed over the first electrode structure inside the first area, the second area and the third area. A second sacrificial layer is then formed over the first sacrificial layer inside the second area and the third area. A third sacrificial layer is formed over the second sacrificial layer inside the third area. The first sacrificial layer, the second sacrificial layer and the third sacrificial have different etching rates. A patterned support layer is then formed over the first electrode structure. A second electrode layer is formed over the first sacrificial layer inside the first area, the second sacrificial layer inside the second area, the third sacrificial layer inside the third area, and a portion of the patterned support layer. Finally, the first sacrificial layer, the second sacrificial layer and the third sacrificial layer are removed to form a plurality of air gaps between the first electrode structure and the second electrode layer.

According to the method of fabricating the optical interference color display in accordance with an embodiment of the present invention, the substrate comprises, for example, a glass substrate or a plastic substrate.

According to the method of fabricating the optical interference color display in accordance with an embodiment of the present invention, the method of forming the first electrode structure comprises the following steps. A plurality of first electrodes is formed over the substrate. An absorption layer is then formed over the first electrodes. Finally, an optical layer is formed over the absorption layer.

According to the method of fabricating the optical interference color display in accordance with an embodiment of the present invention, the first electrodes are, for example, transparent electrodes, and the material of the first electrodes comprises, for example, indium tin oxide (ITO).

According to the method of fabricating the optical interference color display in accordance with an embodiment of the present invention, the material of the absorption layer comprises, for example, Chromium (Cr) or Molybdenum chromium (MoCr).

According to the method of fabricating the optical interference color display in accordance with an embodiment of the present invention, the material of the optical layer comprises, for example, silicon nitride or silicon oxide.

According to the method of fabricating the optical interference color display in accordance with an embodiment of the present invention, the material of the patterned support layer comprises, for example, a photoresist layer.

According to the method of fabricating the optical interference color display in accordance with an embodiment of the present invention, the etching rate of the second sacrificial layer is more than 1.5 times of the etching rate of the first sacrificial layer, and the etching rate of the third sacrificial layer is more than 1.5 times of the etching rate of the second sacrificial layer.

According to the method of fabricating the optical interference color display in accordance with an embodiment of the present invention, the material of the first sacrificial layer is selected from a group consisting of MoCr, Cr, polysilicon, amorphous silicon and N-type amorphous silicon, for example.

According to the method of fabricating the optical interference color display in accordance with an embodiment of the present invention, the material of the second sacrificial layer is selected from a group consisting of MoCr, Cr, polysilicon, amorphous silicon and N-type amorphous silicon, for example.

According to the method of fabricating the optical interference color display in accordance with an embodiment of the present invention, the material of the third sacrificial layer is selected from a group consisting of MoCr, Cr, polysilicon, amorphous silicon and N-type amorphous silicon, for example.

According to the method of fabricating the optical interference color display in accordance with an embodiment of the present invention, the second electrode layer is a metal electrode. The material of the second electrode layer is selected from a group consisting of Mo, Mo alloy, aluminum, aluminum alloy, Cr, nickel, titanium, and a combination thereof, for example.

As embodied and broadly described herein, the present invention provides a method of fabricating an optical interference color display. In this method, a substrate is provided first. A first electrode structure is formed over the substrate. A first area, a second area, and a third area are then defined on the first electrode structure. A first sacrificial layer is formed over the first electrode structure inside the first area. A second sacrificial layer is formed over the first electrode structure inside the second area. A third sacrificial layer is formed over the first electrode structure inside the third area. The first sacrificial layer, the second sacrificial layer and the third sacrificial have different etching rates and thicknesses. A patterned support layer is then formed over the first electrode structure. A second electrode layer is formed over the first sacrificial layer inside the first area, the second sacrificial layer inside the second area, the third sacrificial layer inside the third area, and a portion of the patterned support layer. Finally, the first sacrificial layer, the second sacrificial layer and the third sacrificial layer are removed to form a plurality of air gaps between the first electrode structure and the second electrode layer.

According to the method of fabricating the optical interference color display in accordance with an embodiment of the present invention, the substrate comprises, for example, a glass substrate or a plastic substrate.

According to the method of fabricating the optical interference color display in accordance with an embodiment of the present invention, the method of forming the first electrode structure comprises the following steps. A plurality of first electrodes is formed over the substrate. An absorption layer is then formed over the first electrodes. Finally, an optical layer is formed over the absorption layer.

According to the method of fabricating the optical interference color display in accordance with an embodiment of the present invention, the first electrodes are, for example, transparent electrodes, and the material of the first electrodes comprises, for example, indium tin oxide (ITO).

According to the method of fabricating the optical interference color display in accordance with an embodiment of the present invention, the material of the absorption layer comprises, for example, Chromium (Cr) or Molybdenum chromium (MoCr).

According to the method of fabricating the optical interference color display in accordance with an embodiment of the present invention, the material of the optical layer comprises, for example, silicon nitride or silicon oxide.

According to the method of fabricating the optical interference color display in accordance with an embodiment of the present invention, the material of the patterned support layer comprises, for example, a photoresist layer.

According to the method of fabricating the optical interference color display in accordance with an embodiment of the present invention, the etching rate of the second sacrificial layer is more than 1.5 times of the etching rate of the first sacrificial layer, and the etching rate of the third sacrificial layer is more than 1.5 times of the etching rate of the second sacrificial layer.

According to the method of fabricating the optical interference color display in accordance with an embodiment of the present invention, the material of the first sacrificial layer is selected from a group consisting of MoCr, Cr, polysilicon, amorphous silicon and N-type amorphous silicon, for example.

According to the method of fabricating the optical interference color display in accordance with an embodiment of the present invention, the material of the second sacrificial layer is selected from a group consisting of MoCr, Cr, polysilicon, amorphous silicon and N-type amorphous silicon, for example.

According to the method of fabricating the optical interference color display in accordance with an embodiment of the present invention, the material of the third sacrificial layer is selected from a group consisting of MoCr, Cr, polysilicon, amorphous silicon and N-type amorphous silicon, for example.

According to the method of fabricating the optical interference color display in accordance with an embodiment of the present invention, the second electrode layer is a metal electrode. The material of the second electrode layer is selected from a group consisting of Mo, Mo alloy, aluminum, aluminum alloy, Cr, nickel, titanium, and a combination thereof, for example.

As embodied and broadly described herein, the present invention provides a method of fabricating an optical interference color display. In this method, a substrate is first provided. A first electrode structure is formed over the substrate. A first area and a second area are then defined on the first electrode structure. A first sacrificial layer is formed over the first electrode structure inside the first area and the second area. A second sacrificial layer is then formed over the first sacrificial layer inside the second area. The first sacrificial layer and the second sacrificial layer have different etching rates. A patterned support layer is then formed over the first electrode structure. A second electrode layer is formed over the first sacrificial layer inside the first area, the second sacrificial layer inside the second area, and a portion of the patterned support layer. Finally, the first sacrificial layer and the second sacrificial layer are removed to form a plurality of air gaps between the first electrode structure and the second electrode layer.

As embodied and broadly described herein, the present invention provides a method of fabricating an optical interference color display. In this method, a substrate is provided first. A first electrode structure is formed over the substrate. A first area and a second area are then defined on the first electrode structure. A first sacrificial layer is formed over the first electrode structure inside the first area. A second sacrificial layer is formed over the first electrode structure inside the second area. The first sacrificial layer and the second sacrificial layer have different etching rates and thicknesses. A patterned support layer is then formed over the first electrode structure. A second electrode layer is formed over the first sacrificial layer inside the first area, the second sacrificial layer inside the second area, and a portion of the patterned support layer. Finally, the first sacrificial layer and the second sacrificial layer are removed to form a plurality of air gaps between the first electrode structure and the second electrode layer.

In the method of fabricating the optical interference color display, materials with different etching rates are used to form sacrificial layers. As a result, the sacrificial layers have different etching rates. While being etched, damage to the sacrificial layers can be prevented, and the better air gaps can be obtained. Accordingly, the optical performance of the optical interference color display can be improved.

The above and other features of the present invention will be better understood from the following detailed description of the preferred embodiments of the invention that is provided in communication with the accompanying drawings.

DESCRIPTION OF SOME EMBODIMENTS

First Embodiment

Figure 3A:
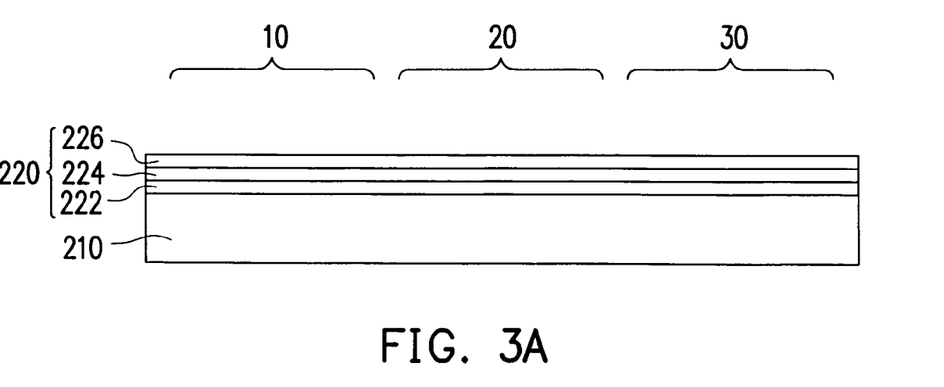
FIGS. 3A-3F are cross sectional views showing progress of a method of fabricating an optical interference color display according to the first embodiment of the present invention.

FIGS. 3A-3F are cross sectional views showing progress of a method of fabricating an optical interference color display according to the first embodiment of the present invention. Referring to FIG. 3A, a transparent substrate 210 is provided. Its material can be, for example, glass or plastic. A first electrode structure 220 is then formed over the transparent substrate 210.

The method of forming the first electrode structure 220 can be, for example, a physical vapor deposition (PVD) process or other suitable processes, to deposit indium tin oxide (ITO) over the transparent substrate 210. The ITO layer is then patterned by a photolithographic process and an etching process to form a plurality of first transparent electrodes 222. An absorption layer 224 is then deposited over the first electrodes 222 and partial area of the substrate 210 where no first electrodes 222 are formed. In one embodiment of the present invention, the material of the absorption layer 224 can be, for example, Chromium (Cr) or Molybdenum chromium (MoCr).

Finally, an optical layer 226 is deposited over the absorption layer 224. Wherein, the material of the optical layer 226 can be, for example, silicon nitride or silicon oxide. Of course, the optical layer 226 is not limited to a single layer. It may comprise a plurality of dielectric layers with high refractive index and a plurality of dielectric layers with high refractive index stacked alternately. The steps described above form the first electrode structure 220. The first electrode structure 220 comprises the first electrodes 222, the absorption layer 224 and the optical layer 226. In addition, the first area 10, the second area 20 and the third area 30 are defined on the first electrode structure 220.

Figure 3B:
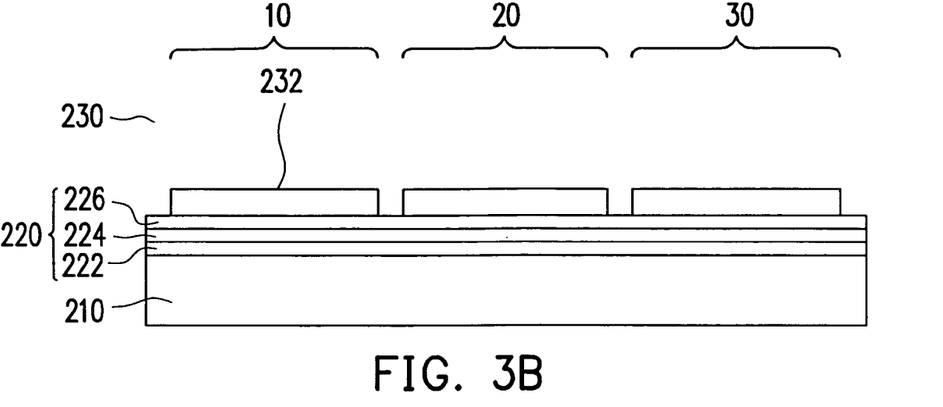

Referring to FIG. 3B, a first sacrificial layer 232 is entirely deposited. Its material can be selected from a group consisting of MoCr, Cr, polysilicon, amorphous silicon and N-type amorphous silicon, for example. Then, a photolithographic process and an etching process are performed to remove the first sacrificial layer 232 outside the first area 10, the second area 20 and the third area 30 to form the first sacrificial layer 232 with designated patterning.

Figure 3C:
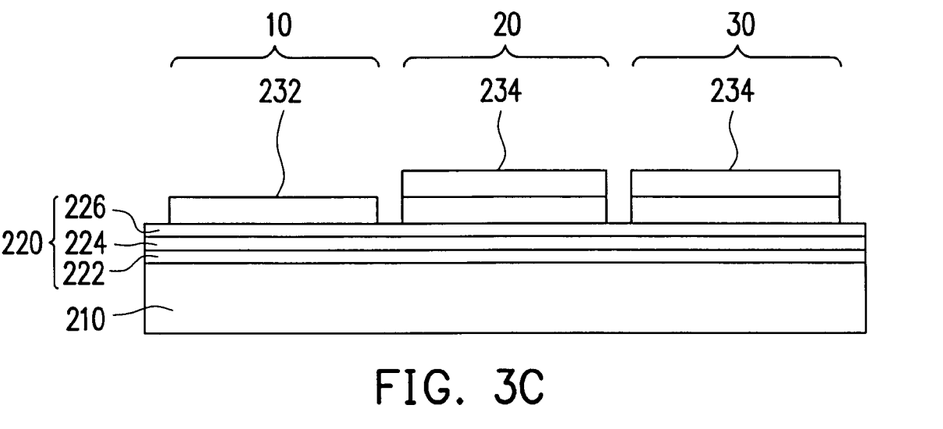

Referring to FIG. 3C, a second sacrificial layer 234 is entirely deposited. The second sacrificial layer 234 has an etching rate at least more than 1.5 times of that of the first sacrificial layer 232. The material of the second sacrificial layer 234 can be selected from a group consisting of MoCr, Cr, polysilicon, amorphous silicon and N-type amorphous silicon, for example. In some embodiments, as long as the etching rate of the second sacrificial layer 234 is higher than that of the first sacrificial layer 232, the material with etching rate higher than the etching rate of the first sacrificial layer 232 mentioned above can be used as the second sacrificial layer 234. For example, the first and the second sacrificial layers may be formed of the same material, such as amorphous silicon. They are then processed under different temperatures so that the first sacrificial layer 232 and the second sacrificial layer 234 have different etching rates. Nevertheless, as long as the materials have different etching rates to the same or different etchants, the materials can be used.

A photolithographic process and an etching process are then performed to remove the second sacrificial layer 234 outside the second area 20 and the third area 30 to form the patterned sacrificial layer 234 with designated patterning. Note that the second sacrificial layer 234 is over the first sacrificial layer 232 while the second sacrificial layer 234 inside the first area 10 is removed. The etch process can be, for example, a wet etch process or other suitable processes to remove the second sacrificial layer 234. Since the second sacrificial layer 234 has a higher etching rate, damage to the first sacrificial layer 232 can be reduced while the etch process is removing the second sacrificial layer 234. Accordingly, the thickness of the first sacrificial layer 232 can be maintained.

Figure 3D:
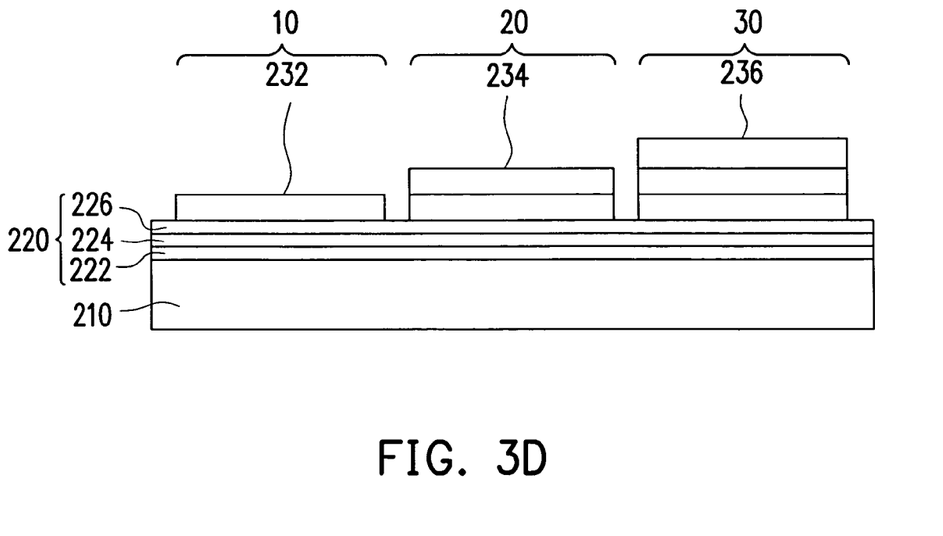

Referring to FIG. 3D, a third sacrificial layer 236 is then entirely deposited. A photolithographic process and an etch process are performed to remove the third sacrificial layer 236 outside the third area 30 to form the third sacrificial layer 236 with designated patterning. The fabrication of the sacrificial layers inside the first area 10, the second area 20 and the third area 30 are thus accomplished.

Note that in order to pattern the third sacrificial layer 236, a wet etch process or other suitable process is used to remove the third sacrificial layer 236 inside the first area 10 and the third sacrificial layer 236 inside the second area 20. The etching rate of the third sacrificial layer 236 of the first area 10 is higher than that of the first sacrificial layer 232. Though the first sacrificial layer 232 is under the second sacrificial layer 234, the first sacrificial layer 232 will not be damaged while the third sacrificial layer 236 is removed.

Similarly, the etching rate of the third sacrificial layer 236 of the second area 20 is more than 1.5 times of that of the second sacrificial layer 234, for example. Though the second sacrificial layer 234 is under the third sacrificial layer 236, damage to the second sacrificial layer 234 can be reduced due to their different etching rates. In addition, the thicknesses of the sacrificial layers 232, 234, 236 can be well controlled. It should be noted that the removing process of the sacrificial layers 232, 234, 236 is so call releasing process.

Figure 3E:
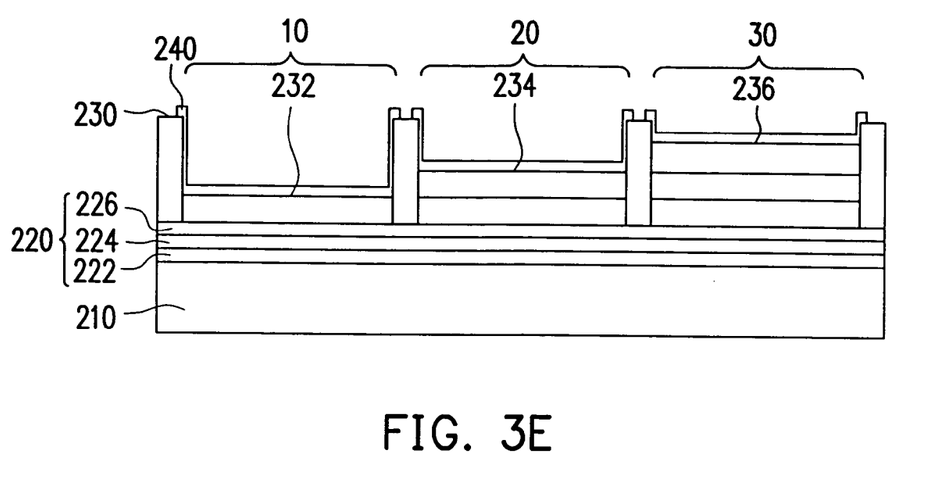

Referring to FIG. 3E, a photoresist layer is entirely coated. The photoresist layer is then patterned to form the patterned support layer 230. Then, a second electrode layer 240 is entirely deposited. The material of the second electrode layer 240 can be a light-reflective metal, such as Mo, Mo alloy, aluminum, aluminum alloy, Cr, nickel, titanium, or a combination thereof. A photolithographic process and an etch process are then performed to form the patterned second electrode layer 240. The second electrode layer 240 is formed over the first sacrificial layer 232 inside the first area 10, the second sacrificial layer 234 inside the second area 20, the third sacrificial layer 236 inside the third area 30 and a portion of the patterned support layer 230.

Figure 3F:
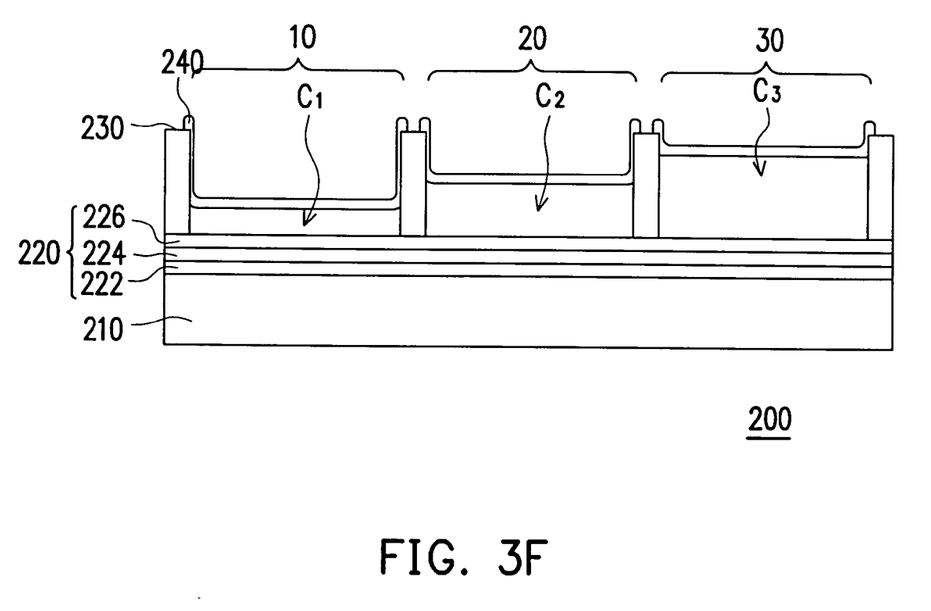

Referring to FIG. 3F, all of these sacrificial layers are removed by using suitable etchant, e.g. $XeF_6$, to form different air gaps C1, C2 and C3. In detail, after forming the second electrode layer 240 over the sacrificial layers with different thicknesses and performing releasing process, different air gaps C1, C2 and C3 can be formed simultaneously. In addition, the air gaps C1, C2 and C3 generally are smaller than, or equal to 1 μm. In this embodiment, the sacrificial layers have different etching rates. By depositing the sacrificial layer with a smaller etching rate first, damage to the earlier-deposited sacrificial layer can be reduced.

Compared with the prior art technology, the present invention can well control the thicknesses of the sacrificial layers and improve the quality of the air gaps C1, C2, C3 and the manufacturing yields. The optical performance of the optical interference color display 200 can also be enhanced.

Second Embodiment

Figure 4A:
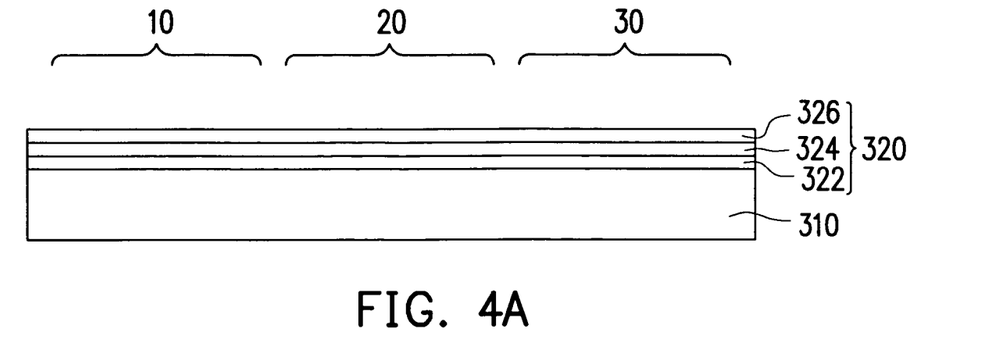
FIGS. 4A-4F are cross sectional views showing progress of a method of fabricating an optical interference color display according to the second embodiment of the present invention.

FIGS. 4A-4F are cross sectional views showing progress of a method of fabricating an optical interference color display according to the second embodiment of the present invention. Referring to FIG. 4A, the steps are similar to those shown in FIG. 3A. A first electrode structure 220 is formed and the first area 10, the second area 20 and the third area 30 are defined.

Figure 4B:
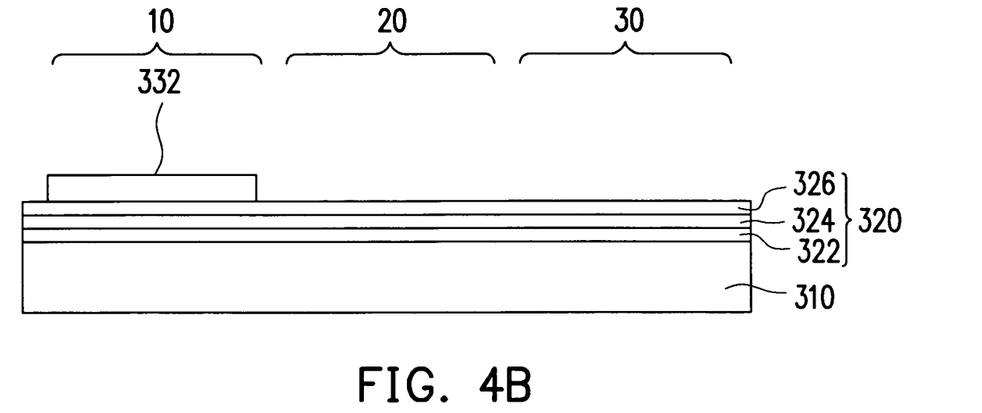

Referring to FIG. 4B, a first sacrificial layer 332 is entirely deposited. The material of the first sacrificial layer 332 can be selected from a group consisting of MoCr, Cr, polysilicon, amorphous silicon and N-type amorphous silicon, for example. Then, a photolithographic process and an etching process are performed to remove the first sacrificial layer 332 outside the first area 10 to form the first sacrificial layer 332 with designate patterning.

Figure 4C:
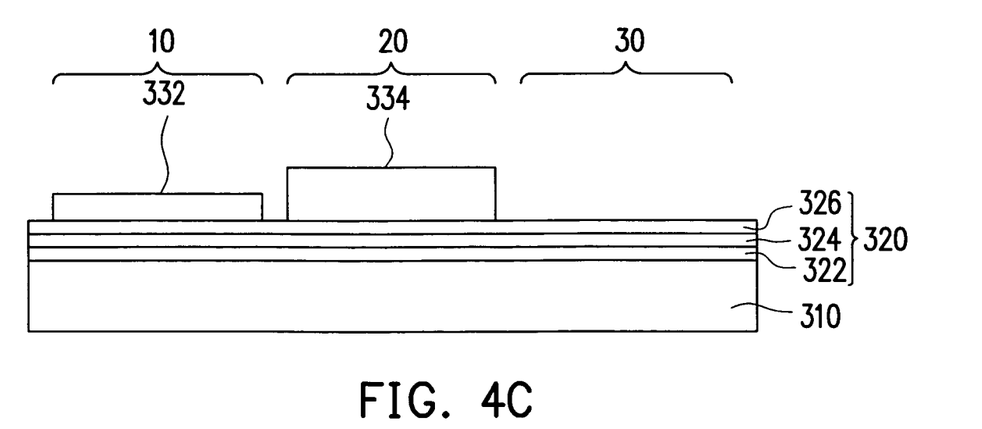

Referring to FIG. 4C, a second sacrificial layer 334 is entirely deposited. The material of the second sacrificial layer 334 has an etching rate at least more than 1.5 times of that of the first sacrificial layer 332, for example. The material of the second sacrificial layer 334 can be selected from a group consisting of MoCr, Cr, polysilicon, amorphous silicon and N-type amorphous silicon, for example. In some embodiments, as long as the etching rate of the second sacrificial layer 334 is higher than that of the first sacrificial layer 332, the material of the second sacrificial layer 334 can be used. For example, the first and the second sacrificial layers may be formed of the same material, such as amorphous silicon. They are then processed under different temperatures so that the first sacrificial layer 332 and the second sacrificial layer 334 have different etching rates. Nevertheless, whether the etchants are the same or different, as long as the sacrificial layers have different etching rates, the materials can be used.

A photolithographic process and an etching process are then performed to the second sacrificial layer 334 to remove the second sacrificial layer 334 outside the second area 20 to form the second sacrificial layer 334 with designate patterning. Note that the second sacrificial layer 334 is on top of the first sacrificial layer 332 while the second sacrificial layer 334 of the first area 10 is removed. The etch process can be, for example, a wet etch process or other suitable processes to remove the second sacrificial layer 334. Since the second sacrificial layer 334 has a higher etching rate, damage to the first sacrificial layer 332 can be reduced while the second sacrificial layer 334 is removed by the etch process. Accordingly, the thickness of the first sacrificial layer 332 can be maintained.

Figure 4D:
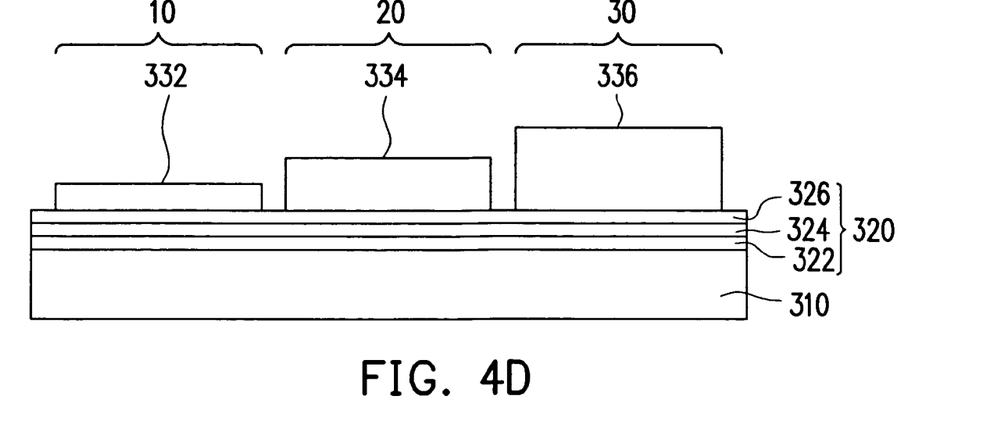

Referring to FIG. 4D, a third sacrificial layer 336 is then entirely deposited. A photolithographic process and an etch process are performed to remove the third sacrificial layer 336 outside the third area 30 to form the third sacrificial layer 336 with designate patterning. The sacrificial layers inside the first area 10, the second area 20 and the third area 30 are thus accomplished.

Note that in order to pattern the third sacrificial layer 336, a wet etch process or other suitable process is used to remove the third sacrificial layer 336 inside the first area 10 and the third sacrificial layer 336 inside the second area 20. The etching rate of the third sacrificial layer 336 inside the first area 10 is higher than that of the first sacrificial layer 332. Though below the first sacrificial layer 332 is underneath, the first sacrificial layer 332 will not be damaged while the third sacrificial layer 336 is removed.

Similarly, the etching rate of the third sacrificial layer 336 inside the second area 20 is more than 1.5 times of that of the second sacrificial layer 334, for example. Though the second sacrificial layer 334 is below the third sacrificial layer 336, damage to the second sacrificial layer 334 can be reduced due to their different etching rates. In addition, the thicknesses of the sacrificial layers can be well controlled.

Figure 4E:
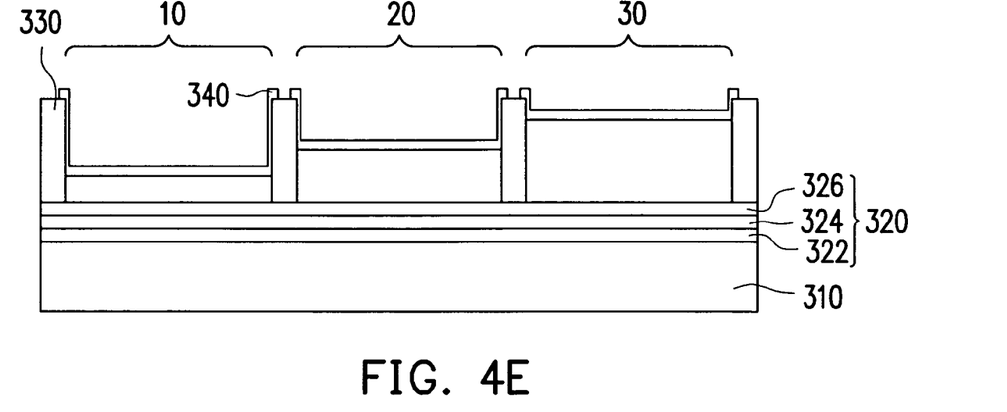

Referring to FIG. 4E, a photoresist layer is entirely coated. The photoresist layer is then patterned to form the patterned support layer 330. Then, a second electrode layer 340 is entirely deposited. The material of the second electrode layer 340 can be a light-reflective metal, such as Mo, Mo alloy, aluminum, aluminum alloy, Cr, nickel, titanium, or a combination thereof. A photolithographic process and an etch process are then performed to form the second electrode layer 340 with designate patterning. The second electrode layer 340 is formed over the first sacrificial layer 332 inside the first area 10, the second sacrificial layer 334 inside the second area 20, the third sacrificial layer 336 inside the third area 30 and a portion of the patterned support layer 330.

Figure 4F:
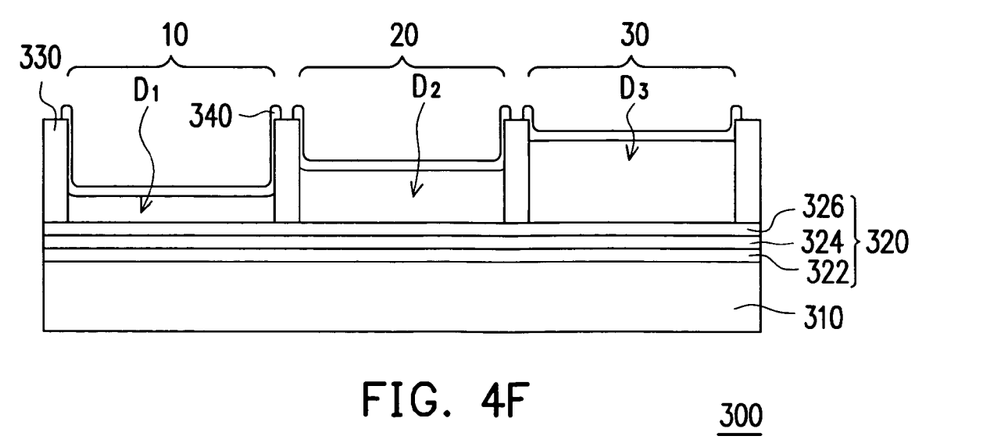

Referring to FIG. 4F, the steps of forming different air gaps C1, C2 and C3 as shown in FIG. 3F are illustrated. In detail, after forming the second electrode layer 340 over the sacrificial layers with different thicknesses and performing releasing process, different air gaps D1, D2 and D3 can be defined. In this embodiment, by depositing the sacrificial layer with a smaller etching rate first, damage to the earlier-deposited sacrificial layer can be reduced.

Embodiments described above are methods to form the air gaps C1-C3 and D1-D3. The present invention, however, is not limited thereto. In the method of fabricating the optical interference color display of the present invention, only two different air gaps may be formed. The fabrication method is similar to that described above. What is different is that mere the first and the second sacrificial layers are formed in other embodiment In addition, in the method of fabricating the optical interference color display of the present invention, more than three different air gaps can be formed. The fabrication method is similar to that described above. What is different is that in addition to the first, the second and the third sacrificial layers, additional sacrificial layers can be formed.

Accordingly, the method of fabricating the optical interference color display comprises the following advantages:

1. In the method of fabricating the optical interference color display of the present invention, damage to the sacrificial layers can be avoided. The air gaps can be well controlled and the manufacturing yields can be improved. Accordingly, the optical performance of the optical interference color display is enhanced.
2. In the method of fabricating the optical interference color display of the present invention, materials with different etching rates are used to form the sacrificial layers. Damage to the sacrificial layers can be prevented and the thicknesses of the sacrificial layers can also be precisely controlled.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of fabricating an optical interference color display, comprising:
    providing a substrate, and forming a first electrode structure over the substrate;
    defining a first area, a second area, and a third area on the first electrode structure;
    forming a first sacrificial layer over the first electrode structure inside the first area, the second area and the third area; forming a second sacrificial layer over the first sacrificial layer inside the second area and the third area;
    forming a third sacrificial layer over the second sacrificial layer inside the third area, wherein the first sacrificial layer, the second sacrificial layer and the third sacrificial layer have different etching rates, wherein the etching rate of the second sacrificial layer is higher than the etching rate of the first sacrificial layer, and wherein the etching rate of the third sacrificial layer is higher than the etching rate of the second sacrificial layer;
    forming a patterned support layer over the first electrode structure;
    forming a second electrode layer over the first sacrificial layer inside the first area, the second sacrificial layer inside the second area, the third sacrificial layer inside the third area and a portion of the patterned support layer; and
    removing the first sacrificial layer, the second sacrificial layer and the third sacrificial layer to form a plurality of air gaps between the first electrode structure and the second electrode layer wherein the plurality of air gaps provides a plurality of colors.

2. The method of fabricating an optical interference color display of claim 1, wherein the substrate comprises a glass substrate or a plastic substrate.

3. The method of fabricating an optical interference color display of claim 1, wherein the steps of forming the first electrode structure comprise:
    forming a plurality of first electrodes over the substrate;
    forming an absorption layer over the first electrodes; and
    forming an optical layer over the absorption layer.

4. The method of fabricating an optical interference color display of claim 3, wherein the first electrodes are transparent electrodes, and the first electrodes comprises indium tin oxide (ITO).

5. The method of fabricating an optical interference color display of claim 3, wherein the absorption layer comprises Chromium (Cr) or Molybdenum chromium (MoCr).

6. The method of fabricating an optical interference color display of claim 3, wherein the optical layer comprises silicon nitride or silicon oxide.

7. The method of fabricating an optical interference color display of claim 1, wherein the patterned support layer comprises a photoresist layer.

8. The method of fabricating an optical interference color display of claim 1, wherein the etching rate of the second sacrificial layer is more than 1.5 times of the etching rate of the first sacrificial layer, and the etching rate of the third sacrificial layer is more than 1.5 times of the etching rate of the second sacrificial layer.

9. The method of fabricating an optical interference color display of claim 1, wherein the first sacrificial layer is selected from a group consisting of MoCr, Cr, polysilicon, amorphous silicon and N-type amorphous silicon.

10. The method of fabricating an optical interference color display of claim 1, wherein the second sacrificial layer is selected from a group consisting of MoCr, Cr, polysilicon, amorphous silicon and N-type amorphous silicon.

11. The method of fabricating an optical interference color display of claim 1, wherein the third sacrificial layer is selected from a group consisting of MoCr, Cr, polysilicon, amorphous silicon and N-type amorphous silicon.

12. The method of fabricating an optical interference color display of claim 1, wherein the second electrode layer is a metal electrode, and the second electrode layer is selected from a group consisting of Mo, Mo alloy, aluminum, aluminum alloy, Cr, nickel, titanium, and a combination thereof.

* * * * *

UNITED STATES PATENT AND TRADEMARK OFFICE
CERTIFICATE OF CORRECTION

PATENT NO. : 7,547,565 B2
APPLICATION NO. : 11/133641
DATED : June 16, 2009
INVENTOR(S) : Wen-Jian Lin Page 1 of 1

It is certified that error appears in the above-identified patent and that said Letters Patent is hereby corrected as shown below:

At column 2, line 61, please delete "compatable" and insert therefore, --compatible--.

At column 2, line 70, please delete "Quanum" and insert therefore, --Quantum--.

At column 1, line 14, please delete "polycarbonate" and insert therefore, --polycarbonates--.

At column 1, line 27, please delete "Interfereometers" and insert therefore, --Interferometers--.

At column 1, line 31, please delete "Youk" and insert therefore, --York--.

At column 2, line 48, please delete "systesm" and insert therefore, --system--.

At column 2, line 49, please delete "Comparision" and insert therefore, --Comparison--.

At column 2, line 50, please delete "Physice" and insert therefore, --Physics--.

At column 10, line 33, please delete "layer" in Claim 1 and insert therefore, --layer,--.

Signed and Sealed this

Sixteenth Day of February, 2010

David J. Kappos
*Director of the United States Patent and Trademark Office*